US007507668B2

(12) United States Patent
Ishibashi et al.

(10) Patent No.: US 7,507,668 B2
(45) Date of Patent: Mar. 24, 2009

(54) POLISHING SLURRY, METHOD OF TREATING SURFACE OF $GA_XIN_{1-X}AS_YP_{1-Y}$ CRYSTAL AND $GA_XIN_{1-X}AS_YP_{1-Y}$ CRYSTAL SUBSTRATE

(75) Inventors: Keiji Ishibashi, Itami (JP); Takayuki Nishiura, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/527,682

(22) Filed: Sep. 27, 2006

(65) Prior Publication Data

US 2007/0075041 A1 Apr. 5, 2007

(30) Foreign Application Priority Data

Sep. 30, 2005 (JP) ............................ 2005-288278

(51) Int. Cl.
*H01L 21/302* (2006.01)

(52) U.S. Cl. ........................................ 438/692; 216/89

(58) Field of Classification Search ................. 438/689, 438/690, 691, 692, 693; 252/79.1; 216/89
See application file for complete search history.

(56) References Cited

U.S. PATENT DOCUMENTS 5,264,010 A * 11/1993 Brancaleoni et al. .......... 51/308
5,575,706 A * 11/1996 Tsai et al. ................... 438/693
5,620,357 A * 4/1997 Misaka et al. .................. 451/9
5,695,384 A * 12/1997 Beratan ....................... 451/28
5,705,435 A * 1/1998 Chen ............................. 438/8
5,861,055 A * 1/1999 Allman et al. ................. 106/3
6,162,112 A * 12/2000 Miyazaki et al. .............. 451/36
2004/0221516 A1* 11/2004 Cho et al. ..................... 51/308
2005/0050803 A1* 3/2005 Amanokura et al. .......... 51/309
2005/0090109 A1* 4/2005 Carter et al. ................ 438/692

FOREIGN PATENT DOCUMENTS

JP 64-87147 A 3/1989
JP 07-276225 10/1995
JP 10-214809 8/1998
JP 11-060232 3/1999
JP 11-283943 10/1999
JP 3077665 6/2000
JP 2002-025954 1/2002
JP 2002-338232 11/2002
JP 2005-264057 9/2005

OTHER PUBLICATIONS

Japanese Office Action with English Translation, issued in Japanese Patent Application No. JP 2005-288278 dated on Aug. 26, 2008.
Japanese Office Action, with English Translation, issued in Japanese Patent Application No. JP 2005-288278, dated Nov. 18, 2008.

* cited by examiner

*Primary Examiner*—Kin-Chan Chen
(74) *Attorney, Agent, or Firm*—McDermott Will & Emery LLP

(57) ABSTRACT

The present polishing slurry is a polishing slurry for chemically mechanically polishing a surface of a $Ga_xIn_{1-x}As_yP_{1-y}$ crystal ($0 \leqq x \leqq 1$, $0 \leqq y \leqq 1$), characterized in that this polishing slurry contains abrasive grains formed of $SiO_2$, this abrasive grain is a secondary particle in which a primary particle is associated, and a ratio $d_2/d_1$ of an average particle diameter $d_2$ of a secondary particle to an average particle diameter $d_1$ of a primary particle is not less than 1.6 and not more than 10. According to such the polishing slurry, a crystal surface having a small surface roughness can be formed on a $Ga_xIn_{1-x}As_yP_{1-y}$ crystal at a high polishing rate and effectively.

5 Claims, 2 Drawing Sheets

39
31c
34
31
1
1a
38
37
35
35c

POLISHING SLURRY, METHOD OF TREATING SURFACE OF $GA_XIN_{1-X}AS_YP_{1-Y}$ CRYSTAL AND $GA_XIN_{1-X}AS_YP_{1-Y}$ CRYSTAL SUBSTRATE

BACKGROUND OF THE INVENTION

1. Field of the Invention

The present invention relates to a polishing slurry for chemically mechanically polishing a surface of a $Ga_xIn_{1-x}As_yP_{1-y}$ crystal used in a substrate for a semiconductor device such as a light emitting element, an electronic element and a semiconductor sensor, a method of treating a surface of a $Ga_xIn_{1-x}As_yP_{1-y}$ crystal using the polishing slurry, and a $Ga_xIn_{1-x}As_yP_{1-y}$ crystal substrate obtained by the surface treating method.

2. Description of the Background Art

A $Ga_xIn_{1-x}As_yP_{1-y}$ crystal ($0 \leqq x \leqq 1$, $0 \leqq y \leqq 1$) such as a GaAs crystal and an InP crystal is very useful as a material for forming a substrate of a semiconductor device such as a light emitting element, an electronic element and a semiconductor sensor.

The $Ga_xIn_{1-x}As_yP_{1-y}$ crystal substrate ($0 \leqq x \leqq 1$, $0 \leqq y \leqq 1$) used as a substrate for a semiconductor device is obtained by subjecting an external circumference of a $Ga_xIn_{1-x}As_yP_{1-y}$ crystal to shape forming processing, slicing the crystal to have a predetermined thickness, and grinding or lapping a surface thereof and, by such the slicing and, grinding or lapping, a procession denatured layer (this refers to a layer in which crystal lattices are disturbed, which is formed on a surface side region of a crystal by processing a crystal surface; the same hereinafter) is formed on a surface side region of the $Ga_xIn_{1-x}As_yP_{1-y}$ crystal, and a roughness of a surface of the $Ga_xIn_{1-x}As_yP_{1-y}$ crystal becomes great.

As a thickness of the procession denatured layer of this $Ga_xIn_{1-x}As_yP_{1-y}$ crystal substrate becomes greater, or as a surface roughness thereof becomes greater, quality of a substrate surface is deteriorated, irregularities of a surface of a Group III-V compound crystal layer which is epitaxial-grown on this $Ga_xIn_{1-x}As_yP_{1-y}$ crystal become great, and crystallizability of the surface is deteriorated. For this reason, a semiconductor device of better quality cannot be formed.

For this reason, as a method of forming a $Ga_xIn_{1-x}As_yP_{1-y}$ crystal substrate from a $Ga_xIn_{1-x}As_yP_{1-y}$ crystal, the following method is widely performed: a $Ga_xIn_{1-x}As_yP_{1-y}$ crystal is sliced to have a predetermined thickness, a surface thereof is ground or lapped and, further, the surface is polished chemically and mechanically, thereby, a procession denatured layer of a $Ga_xIn_{1-x}As_yP_{1-y}$ crystal is removed, and a surface roughness is reduced.

As a polishing slurry for chemically mechanically polishing a surface of the $Ga_xIn_{1-x}As_yP_{1-y}$ crystal, a polishing slurry containing spherical colloidal silica abrasive grains, an inorganic salt, and alkali metal chlorinated isocyanurate which is an oxidizing agent (e.g. see Japanese Patent Publication No. 3077665 (hereinafter, referred to as Patent Document 1)), and a polishing slurry containing spherical colloidal silica abrasive grains, a mineral acid and persulfate which is an oxidizing agent (e.g. see Japanese Patent Laying-Open No. 64-087147 (hereinafter, referred to as Patent Document 2)) are proposed. In chemical mechanical polishing (hereinafter, referred to as CMP) using these polishing slurries, a surface of a $Ga_xIn_{1-x}As_yP_{1-y}$ crystal is oxidized with an oxidizing agent and a mineral acid to form an oxidized layer, and this oxidized layer is removed with colloidal silica abrasive grains.

However, in polishing slurries shown in Patent Document 1 and Patent Document 2, since spherical colloidal silica abrasive grains are used as abrasive grains, a rate of polishing a $Ga_xIn_{1-x}As_yP_{1-y}$ crystal is low due to a low rate of removing the oxidized layer, and an efficiency of CMP is low. When a colloidal silica abrasive grain having a large particle diameter is used, a polishing rate can be enhanced, but a surface roughness is increased. In addition, also when an abrasive grain having a higher hardness than that of a colloidal silica abrasive grain, such as an $Al_2O_3$ abrasive grain is used, a polishing rate can be enhanced, but since a new procession denatured layer is formed due to this abrasive grain having a high hardness, better surface quality can not be obtained.

SUMMARY OF THE INVENTION

An object of the present invention is to provide a polishing slurry which can form a crystal surface having a small surface roughness on a $Ga_xIn_{1-x}As_yP_{1-y}$ crystal at a high polishing rate and effectively, a method of treating a surface of a $Ga_xIn_{1-x}As_yP_{1-y}$ crystal using such the polishing slurry, and a $Ga_xIn_{1-x}As_yP_{1-y}$ crystal substrate obtained by such the surface treating method.

The present invention provides a polishing slurry for chemically mechanically polishing a surface of a $Ga_xIn_{1-x}As_yP_{1-y}$ crystal ($0 \leqq x \leqq 1$, $0 \leqq y \leqq 1$), characterized in that this polishing slurry contains abrasive grains formed of $SiO_2$, this abrasive grain is a secondary particle in which primary particles are associated, and a ratio $d_2/d_1$ of an average particle diameter $d_2$ of a secondary particle to an average particle diameter $d_1$ of a primary particle is not less than 1.6 and not more than 10.

In the polishing slurry of the present invention, an average particle diameter $d_2$ of a secondary particle of an abrasive grain can be not less than 30 nm and not more than 300 nm. In addition, a shape of an abrasive grain may be at least any shape of a cocoon shape, a mass shape and a chain shape. In addition, the abrasive grain content can be not less than 5 mass % and not more than 40 mass %. In addition, an abrasive grain can be formed of colloidal silica. In addition, a value X of a pH and a value Y (mV) of a oxidation-reduction potential of the polishing slurry can satisfy both relationships of the following equation (1) and equation (2):

$$Y \geqq -50X+1000 \quad (1)$$

$$Y \leqq -50X+1900 \quad (2)$$

In addition, a pH of the polishing slurry can be not more than 5 or not less than 8. In addition, the polishing slurry can contain the aforementioned abrasive grains, an organic acid and/or a salt thereof, and an oxidizing agent.

Also, the present invention provides a method of treating a surface of a $Ga_xIn_{1-x}As_yP_{1-y}$ crystal ($0 \leqq x \leqq 1$, $0 \leqq y \leqq 1$) using a polishing slurry, and this surface treating method is a method of treating a surface of a $Ga_xIn_{1-x}As_yP_{1-y}$ crystal including the steps of: preparing a polishing slurry characterized in that the polishing slurry contains abrasive grains formed of $SiO_2$, this abrasive grain is a secondary particle in which primary particles are associated, and a ratio $d_2/d_1$ of an average particle diameter $d_2$ of a secondary particle to an average particle diameter $d_1$ of a primary particle is not less than 1.6 and not more than 10; and chemically mechanically polishing a surface of a $Ga_xIn_{1-x}As_yP_{1-y}$ crystal using the polishing slurry.

In the method of treating a surface of a $Ga_xIn_{1-x}As_yP_{1-y}$ crystal of the present invention, a step of chemically mechanically polishing a surface of a $Ga_xIn_{1-x}As_yP_{1-y}$ crystal using the polishing slurry can be performed by rotating a polishing pad and a $Ga_xIn_{1-x}As_yP_{1-y}$ crystal on different rotation axes at a rotation number of not less than 10/min and not more than 200/min and at a polishing pressure of not less than 4.9 kPa (50 gf/cm$^2$) and not more than 98 kPa (1000 gf/cm$^2$) by interposing the polishing slurry between the polishing pad and the $Ga_xIn_{1-x}As_yP_{1-y}$ crystal.

The method of treating a surface of a $Ga_xIn_{1-x}As_yP_{1-y}$ crystal of the present invention can include a step of washing a surface of the chemically mechanically polished $Ga_xIn_{1-x}As_yP_{1-y}$ crystal with pure water after the step of chemically mechanically polishing. Alternatively, the step may include a step of polishing a surface of the chemically mechanically polished $Ga_xIn_{1-x}As_yP_{1-y}$ crystal using a polishing solution formed of an acidic aqueous solution or a basic aqueous solution after the step of chemical mechanical polishing. Further, the method may include a step of washing a surface of the $Ga_xIn_{1-x}As_yP_{1-y}$ crystal which has been polished using the polishing solution with pure water after the step of polishing using the polishing solution.

Also, the present invention provides a $Ga_xIn_{1-x}As_yP_{1-y}$ crystal substrate obtained by a method of treating a surface of a $Ga_xIn_{1-x}As_yP_{1-y}$ crystal, in which the surface treating method includes the steps of: preparing a polishing slurry characterized in that the polishing slurry contains abrasive grains formed of $SiO_2$, this abrasive grain is a secondary particle in which primary particles are associated, and a ratio $d_2/d_1$ of an average particle diameter $d_2$ of a secondary particle to an average particle diameter $d_1$ of a primary particle is not less than 1.6 and not more than 10; and chemically mechanically polishing a surface of a $Ga_xIn_{1-x}As_yP_{1-y}$ crystal using this polishing slurry.

According to the present invention, a polishing slurry which can form a crystal surface having a small surface roughness on a $Ga_xIn_{1-x}As_yP_{1-y}$ crystal at a high polishing rate and effectively, a method of treating a surface of a $Ga_xIn_{1-x}As_yP_{1-y}$ crystal using such the polishing slurry, and a $Ga_xIn_{1-x}As_yP_{1-y}$ crystal substrate obtained by such the surface treating method can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

One embodiment of a polishing slurry of the present invention is a polishing slurry for chemically mechanically polishing a surface of a $Ga_xIn_{1-x}As_yP_{1-y}$ crystal ($0 \leqq x \leqq 1$, $0 \leqq y \leqq 1$), characterized in that this polishing slurry contains abrasive grains formed of $SiO_2$, this abrasive grain is a secondary particle in which primary particles are associated, and a ratio $d2/d_1$ of an average particle diameter $d_2$ of a secondary particle to an average particle diameter $d_1$ of a primary particle is not less than 1.6 and not more than 10.

Figure 1:
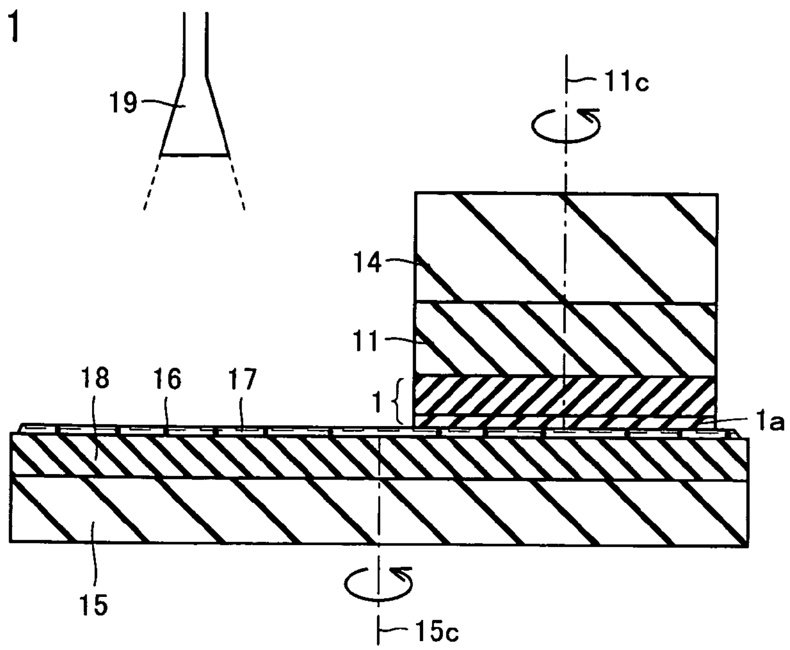
FIG. 1 is a schematic cross-sectional view showing a method of chemically mechanically polishing a surface of a $Ga_xIn_{1-x}As_yP_{1-y}$ crystal in the present invention.

Herein, chemical mechanical polishing refers to smoothing chemically and mechanically a surface of a subject to be abraded, using a polishing slurry. Referring to FIG. 1, for example, a surface of a $Ga_xIn_{1-x}As_yP_{1-y}$ crystal 1 can be chemically mechanically polished by pressing $Ga_xIn_{1-x}As_yP_{1-y}$ crystal 1 against a polishing pad 18 while polishing pad 18 fixed on a platen 15 is rotated around a rotation axis 15*c*, and while a polishing slurry 17 is supplied on polishing pad 18 from a polishing slurry supply port 19, and a weight 14 is placed on a crystal holder 11 to which $Ga_xIn_{1-x}As_yP_{1-y}$ crystal 1 is fixed, and this is rotated around a rotation axis 11*c* of crystal holder 11.

Polishing slurry 17 of the present embodiment, by containing abrasive grains 16 formed of $SiO_2$, can remove a procession denatured layer 1*a* of $Ga_xIn_{1-x}As_yP_{1-y}$ crystal 1 to reduce a surface roughness.

In addition, since abrasive grain 16 is a secondary particle in which primary particles are associated, a polishing rate is increased, and it becomes possible to effectively treat a surface of $Ga_xIn_{1-x}As_yP_{1-y}$ crystal 1. By association of primary particles to become a secondary particle, an abrasive grain having an edgeless irregular shape on its surface is formed, and a polishing rate can be enhanced without generating a scratch. When an abrasive grain having a surface on which an edge is present is used, a scratch is generated upon polishing, and it becomes difficult to reduce a surface roughness. In addition, from a viewpoint of formation of an edgeless irregular shape, it is preferable that a primary particle is spherical or a shape of a spheroid.

Herein, from a viewpoint that a primary particle is spherical or a shape of a spheroid, and a secondary particle having an edgeless irregular shape on its surface is easily formed, it is preferable that an abrasive grain is formed of $SiO_2$ such as fumed silica and colloidal silica, particularly, colloidal silica. As a method of synthesizing colloidal silica, there are a synthesis method using a water glass (sodium silicate etc.) as a raw material, and a synthesis method using alkoxysilane as a raw material (sol-gel method). The former is low cost, and easily produces colloidal silica in a large amount, and the latter affords an abrasive grain having a high purity. By regulating the synthesis condition, a particle diameter of a primary particle, an association degree of a primary particle, and a particle diameter of a secondary particle can be freely controlled.

In addition, an association degree of abrasive grain 16 is not particularly limited, but from a viewpoint of easy formation of an edgeless irregular shape on its surface, a ratio ($d_2/d_1$ ratio) of an average particle diameter $d_2$ of a secondary particle to an average particle diameter $d_1$ of a primary particle is not less than 1.6 and not more than 10. Further, a $d_2/d_1$ ratio is preferably not less than 2.0 and not more than 8. Herein, an average particle diameter $d_1$ of a primary particle of abrasive grain 16 is calculated by the following equation (4):

$$d_1 = 6/(\rho \times S) \quad (4)$$

from measurement of an adhesion specific surface area (referred to as BET specific surface area; the same hereinafter) by a gas adsorption method. In the equation (4), ρ represents a density of a particle, and S represents a BET specific surface area. In addition, an average particle diameter $d_2$ of a secondary particle of an abrasive grain is calculated by the following equation (5):

$$d_2=(k\times T)/(3\times\pi\times\eta_0\times D) \quad (5)$$

from measurement of a diffusion coefficient in Brownian movement of a particle by a dynamic light scattering method. In the equation (5), k represents a Boltzmann constant, T represents an absolute temperature, $\pi$ represents a ratio of a circumference of a circle to its diameter, $\eta_0$ represents a viscosity of a solvent, and D represents a diffusion coefficient.

An average particle diameter $d_2$ of a secondary particle of abrasion grain 16 is not particularly limited, but from a viewpoint of enhancement of a polishing rate, the diameter is preferably 30 nm or more and, from a viewpoint of reduction in a surface roughness, the diameter is preferably 300 nm or less. From such the viewpoint, an average particle diameter $d_2$ of a secondary particle of abrasive grain 16 is more preferably 60 nm or more, and preferably 250 nm or less.

Figure 2A:
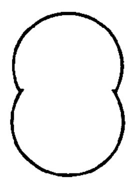
FIG. 2A is a schematic view showing a cocoon-shaped abrasive grain in the polishing slurry of the present invention.
Figure 2B:
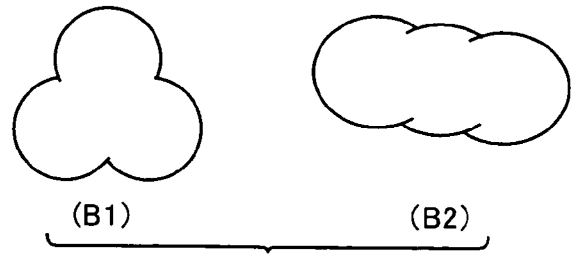
FIG. 2B is a schematic view showing a mass-shaped abrasive grain in the polishing slurry of the present invention.
Figure 2C:
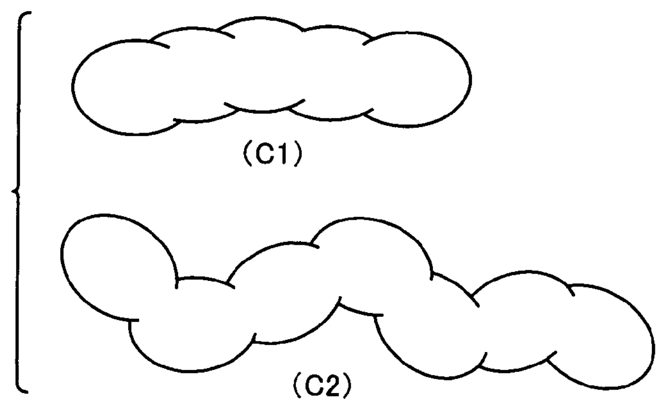
FIG. 2C is a schematic view showing a chain-shaped abrasive grain in the polishing slurry of the present invention.

In addition, a shape of abrasive grain 16 is not particularly limited. Referring to FIG. 2A to FIG. 2C, the shape is, however, from a viewpoint that the particle forms an edgeless irregular shape, at least any shape of a cocoon shape shown in FIG. 2A, a mass shape shown in (B1) and (B2) of FIG. 2B, and a chain shape shown in (C1) and (C2) of FIG. 2C is preferable. Further, from a viewpoint of enhancement of a polishing rate, it is more preferable that a shape of abrasive grain 16 is a mass shape or a chain shape rather than a cocoon shape. Since the polishing slurry of the present embodiment contains abrasive grains having the aforementioned edgeless irregular shape on their surface, mechanical polishing effect is increased, and it becomes possible to enhance a polishing rate without increasing a thickness of procession denatured layer 1_a_. Herein, a shape of abrasive grain 16 can be observed with SEM (scanning electron microscope) and the like.

Polishing slurry 17 of the present embodiment is specifically such that abrasive grains 16 (preferably, colloidal silica abrasive grains) formed of $SiO_2$ are dispersed in water which is a dispersing medium. The abrasive grain content in polishing slurry 17 is not particularly limited, but from a viewpoint of enhancement of a polishing rate, the content is preferably 2 mass % or more and, from a viewpoint of reduction in a surface roughness and enhancement of surface quality, the content is preferably 40 mass % or less. From such the point of view, the abrasive grain content in polishing slurry 17 is more preferably 5 mass % or more, and more preferably 20 mass % or less.

In addition, it is preferable that a value X of a pH and a value Y (mV) of oxidation-reduction potential (referred to as ORP; the same hereinafter) of the polishing slurry of the present embodiment satisfy both relationships of the following equation (1) and equation (2):

$$Y\geqq-50X+1000 \quad (1)$$

$$Y\leqq-50X+1900 \quad (2)$$

Herein, ORP means an energy level (potential) determined by the equilibrium state between an oxidized entity and a reduced entity which are present together in a solution. ORP obtained by measurement is a value relative to a reference electrode and, when a kind of a reference electrode is different, a measured value of the same solution is apparently different. In general academic articles, as a reference electrode, a normal hydrogen electrode (N.H.E) is used in many cases. ORP in the present application is expressed as a value using a normal hydrogen electrode (N.H.E) as a reference electrode.

When a value X of a pH and a value Y (mV) of ORP of polishing slurry 17 of the present embodiment are: Y>−50X+1000, an oxidizing power of polishing slurry 17 is weak, and a rate of polishing a surface of $Ga_xIn_{1-x}As_yP_{1-y}$ crystal 1 is lowered. On the other hand, when Y>−50X+1900,an oxidizing power of polishing slurry 17 becomes too strong, the corroding action on polishing facilities such as a polishing pad and a platen becomes too strong, and stable CMP becomes difficult.

In addition, from a viewpoint of more enhancement of a polishing rate, further, Y≧−50X+1300 is preferable. That is, it is preferable that a value X of a pH and a value Y (mV) of ORP of polishing slurry 17 satisfy both relationships of the following equation (2) and equation (3):

$$Y\leqq-50X+1900 \quad (2)$$

$$Y\geqq-50X+1300 \quad (3)$$

An acid such as hydrochloric acid and sulfuric acid, and a base such as KOH and NaOH which are contained in a conventional polishing slurry are weak in a force of oxidizing a surface of a $Ga_xIn_{1-x}As_yP_{1-y}$ crystal. For this reason, it is preferable that an oxidizing agent is added to the polishing slurry of the present embodiment to enhance ORP, that is, enhance an oxidizing power. An amount of an oxidizing agent to be added is adjusted so that a value X of a pH and a value Y (mV) of ORP of polishing slurry 17 satisfy both relationships of Y≧−50X+1000 (equation (1)) and Y≦−50X1900 (equation (2)).

Herein, an oxidizing agent to be added to a polishing slurry is not particularly limited, but from a viewpoint of enhancement of a polishing rate, chlorinated isocyanuric acid such as trichloroisocyanuric acid, chlorinated isocyanurate such as sodium dichloroisocyanurate, permanganate such as sodium permanganate, dichromate such as potassium dichromate, bromate such as potassium bromate, thiosulfate such as sodium thiosulfate, persulfate such as ammonium persulfate and potassium persulfate, hypochlorous acid, nitric acid, aqueous hydrogen peroxide, ozone, and the like are preferably used. These oxidizing agents may be used alone, or two or more may be used together.

In addition, it is preferable that a pH of polishing slurry 17 of the present embodiment is not more than 5 or not less than 8. By contacting an acidic polishing slurry having a pH of 5 or less or a basic polishing slurry having a pH of 8 or more with a $Ga_xIn_{1-x}As_yP_{1-y}$ crystal to oxidize procession denatured layer 1_a_ of a $Ga_xIn_{1-x}As_yP_{1-y}$ crystal, a polishing rate can be enhanced. From a viewpoint of further enhancement of a polishing rate, a pH of polishing slurry 17 is more preferably not more than 4 or not less than 9, further preferably not more than 3 or not less than 10.

Herein, an acid, a base and a salt which are used for adjusting a pH are not particularly limited, but an inorganic acid such as hydrochloric acid, nitric acid, sulfuric acid, phosphoric acid and carbonic acid, an organic acid such as formic acid, acetic acid, citric acid, malic acid, tartaric acid, succinic acid, phthalic acid and fumaric acid, a base such as KOH, NaOH, $NH_4OH$ and amine, and salts containing these acids or bases can be used. Alternatively, the aforementioned oxidizing agent may be added to adjust a pH.

In particular, in a polishing slurry using the aforementioned organic acid and/or a salt thereof for adjusting a pH, a rate of polishing a $Ga_xIn_{1-x}As_yP_{1-y}$ crystal is enhanced as compared with a polishing slurry using the aforementioned inorganic acid and/or a salt thereof to realize the same pH. From a viewpoint of enhancement of a polishing rate, it is preferable that the organic acid and a salt thereof are carboxylic acid containing 2 or more carboxyl groups in one molecule and a salt thereof, respectively. Herein, preferable examples of dicarboxylic acid include malic acid, succinic acid, phthalic acid and tartaric acid. Preferable examples of tricarboxylic acid include citric acid. Therefore, it is preferable that a polishing slurry contains the abrasive grains, the oxidizing agent, the organic acid and/or a salt thereof.

Embodiment 2

Referring to FIG. 1, a method of treating a surface of a $Ga_xIn_{1-x}As_yP_{1-y}$ crystal ($0 \leqq x \leqq 1$, $0 \leqq y \leqq 1$) of the present invention is a method of treating a surface of a $Ga_xIn_{1-x}As_yP_{1-y}$ crystal 1 using the polishing slurry 17 of the embodiment 1, and includes the steps of: preparing the polishing slurry 17; and chemically mechanically polishing a surface of a $Ga_xIn_{1-x}As_yP_{1-y}$ crystal 1 using this polishing slurry 17. By such the chemical mechanical polishing, a crystal surface having a low surface roughness is obtained at a high polishing rate and effectively.

In the method of treating a surface of a $Ga_xIn_{1-x}As_yP_{1-y}$ crystal of the present embodiment, it is preferable that the step of chemically mechanically polishing a surface of a $Ga_xIn_{1-x}As_yP_{1-y}$ crystal using the polishing slurry is performed by rotating a polishing pad and a $Ga_xIn_{1-x}As_yP_{1-y}$ crystal on different rotating axes at a rotation number of 10/min or more and 200/min or less and at a polishing pressure (corresponding to a pressure applied to $Ga_xIn_{1-x}As_yP_{1-y}$ crystal 1 by pressing against polishing pad 18 in FIG. 1) of not less than 4.9 kPa (50 gf/cm$^2$) and not more than 98 kPa (1000 gf/cm$^2$) by interposing the polishing slurry between the polishing pad and the $Ga_xIn_{1-x}As_yP_{1-y}$ crystal.

When a polishing pressure is less than 4.9 kPa (50 gf/cm$^2$) or a rotation number is less than 10/min, a polishing rate is lowered and, when a polishing pressure is more than 98 kPa (1000 gf/cm$^2$) or a rotation number is more than 2000/min, surface quality of a crystal is deteriorated. From such the viewpoint, in CMP of a GaAs crystal, it is preferable that a polishing pressure is not less than 9.8 kPa (100 gf/cm$^2$) and not more than 49 kPa (500 gf/cm$^2$), and a rotation number of a polishing pad and a GaAs crystal is not less than 30/min and not more than 70/min. In addition, in a $Ga_xIn_{1-x}As_yP_{1-y}$ crystal ($0 \leqq x \leqq 1$, $0 \leqq y \leqq 1$), as x and y are nearer 1, a hardness of a crystal is lowered, and it is further preferable that a polishing pressure of a GaAs crystal is not less than 9.8 kPa (100 gf/cm$^2$) and not more than 29.4 kPa (300 gf/cm$^2$), and a polishing pressure of an InP crystal is not less than 14.7 kPa (150 gf/cm$^2$) and not more than 49 kPa (500 gf/cm$^2$).

It is preferable that the method of treating a surface of a $Ga_xIn_{1-x}As_yP_{1-y}$ crystal of the present embodiment includes a step of washing a surface of the chemically mechanically polished $Ga_xIn_{1-x}As_yP_{1-y}$ crystal with pure water after the step of chemical mechanical polishing. Impurities such as a polishing slurry (abrasive grains and a polishing solution) attached to a surface of a $Ga_xIn_{1-x}As_yP_{1-y}$ crystal during a step of chemical mechanical polishing can be removed by washing a surface of a $Ga_xIn_{1-x}As_yP_{1-y}$ crystal with pure water. A method of washing a $Ga_xIn_{1-x}As_yP_{1-y}$ crystal is not particularly limited, but from a viewpoint of that impurities are effectively removed by mechanical action, an ultrasound washing method, and a scrub washing method are preferably used.

Figure 3:
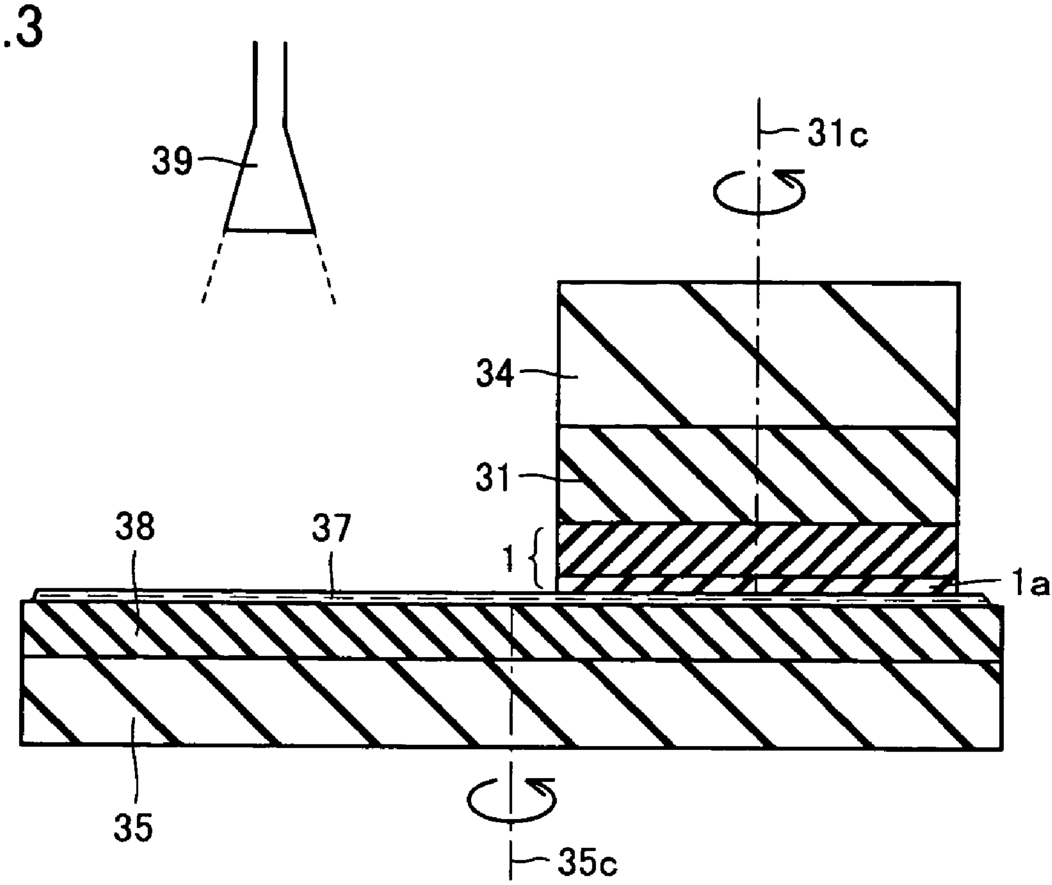
FIG. 3 is a schematic cross-sectional view showing a method of polishing a surface of a $Ga_xIn_{1-x}As_yP_{1-y}$ crystal using a polishing solution in the present invention.

Referring to FIG. 3, it is also preferable that the method of treating a surface of a $Ga_xIn_{1-x}As_yP_{1-y}$ crystal of the present embodiment includes a step of polishing a surface of the chemically mechanically polished $Ga_xIn_{1-x}As_yP_{1-y}$ crystal using a polishing solution formed of an acidic aqueous solution or a basic aqueous solution after the step of chemical mechanical polishing.

Herein, a step of polishing using a polishing solution refers to a step which is performed for removing the impurities attached to a surface of a subject to be abraded using a polishing solution not containing a solid matter such as abrasive grains, like an acidic aqueous solution or a basic aqueous solution. Referring to FIG. 3, for example, impurities on a surface of a $Ga_xIn_{1-x}As_yP_{1-y}$ crystal 1 can be removed by pressing $Ga_xIn_{1-x}As_yP_{1-y}$ crystal 1 against a polishing pad 38 while a polishing pad 38 fixed on a platen 35 is rotated around a rotation axis 35*c*, and while a polishing solution 37 is supplied on a polishing pad 38 from a polishing solution supply port 39, and a weight 34 is placed on a crystal holder 31 to which $Ga_xIn_{1-x}As_yP_{1-y}$ crystal 1 is fixed, and this is rotated around a rotation axis 31*c* of crystal holder 31.

By polishing a surface of $Ga_xIn_{1-x}As_yP_{1-y}$ crystal 1 using polishing solution 37 of the present embodiment formed of an acidic aqueous solution or a basic aqueous solution, impurities such as a polishing slurry (abrasive grains and a polishing solution) attached to a surface of a $Ga_xIn_{1-x}As_yP_{1-y}$ crystal during the step of chemical mechanical polishing can be effectively removed. From a viewpoint of removal of impurities attached to a $Ga_xIn_{1-x}As_yP_{1-y}$ crystal, it is preferable that a polishing solution is an acidic aqueous solution having a pH of 5 or lower, or a basic aqueous solution having a pH of 9 or higher. Herein, an acidic aqueous solution is not particularly limited, but an aqueous solution of an inorganic acid such as hydrochloric acid, nitric acid, sulfuric acid and phosphoric acid, an aqueous solution of an organic acid such as formic acid, acetic acid, citric acid, malic acid, tartaric acid, succinic acid, phthalic acid and fumaric acid, or an aqueous solution containing 2 or more of acids from the inorganic acids and organic acids are preferably used. In addition, a basic aqueous solution is not particularly limited, an aqueous solution of a base such as KOH, NaOH, $NH_4OH$ and amine is preferably used.

Further, it is preferable that the method of treating a surface of a $Ga_xIn_{1-x}As_yP_{1-y}$ crystal of the present embodiment includes a step of washing a surface of the $Ga_xIn_{1-x}As_yP_{1-y}$ crystal which has been polished using a polishing solution with pure water after the step of polishing using the polishing solution. A metal ion and an ion containing a light element of an atomic number of 1 to 18 in an acidic aqueous solution or a basic aqueous solution which are impurities attached to a surface of a $Ga_xIn_{1-x}As_yP_{1-y}$ crystal during a step of polishing using a polishing solution can be effectively removed by washing a surface of a $Ga_xIn_{1-x}As_yP_{1-y}$ crystal with pure water. A method of washing a $Ga_xIn_{1-x}As_yP_{1-y}$ crystal is not particularly limited, but from a viewpoint that the impurities are effectively removed by mechanical action, an ultrasound washing method and a scrub washing method are preferably used.

Embodiment 3

A $Ga_xIn_{1-x}As_yP_{1-y}$ crystal substrate ($0 \leqq x \leqq 1$, $0 \leqq y \leqq 1$) of the present invention is obtained by the surface treating method of the embodiment 2. By the surface treatment method of the embodiment 2, a $Ga_xIn_{1-x}As_yP_{1-y}$ crystal substrate having a low surface roughness is effectively obtained. Herein, as an index expressing a surface roughness, there are a surface roughness Ry and a surface roughness Ra. A surface roughness Ry refers to a sum obtained by extracting only a 10 μm square (10 μm×10 μm=100 μm$^2$; hereinafter the same) as a standard area of a rough curved surface in its average plane direction, and summing a height from an average plane from this extracted part to a highest summit and a depth from the average plane to a lowest valley bottom. In addition, a surface roughness Ra refers to a value obtained by extracting only a 10 μm square as a standard area from a rough curved surface in its average plane direction, summing an absolute value of a deviation from an average plane of this extracted part to a measurement curved surface and averaging it by a standard area. Herein, measurement of surface roughnesses Ry and Ra can be performed by using AFM (by an atomic force microscope; hereinafter the same).

By reducing surface roughnesses Ry and/or Ra of a main plane of a $Ga_xIn_{1-x}As_yP_{1-y}$ crystal substrate, an epitaxial layer having better morphology and crystallizability can be formed on a main plane of a $Ga_xIn_{1-x}As_yP_{1-y}$ crystal, and a semiconductor device having better property can be manufactured. In order to obtain a device having better property, it is preferable that, in a main surface of a $Ga_xIn_{1-x}As_yP_{1-y}$ crystal substrate, a surface roughness Ry is 10 nm or lower, and a surface roughness Ra is 1 nm or lower.

A polishing slurry, a method of treating a surface of a $Ga_xIn_{1-x}As_yP_{1-y}$ crystal using such the polishing slurry, and a $Ga_xIn_{1-x}As_yP_{1-y}$ crystal obtained by such the surface treating method regarding the present invention will be further specifically explained based on the following Examples and Comparative Examples.

EXAMPLE 1

(A-1) Lapping of GaAs crystal

A GaAs crystal grown by a VB (Vertical Bridgeman) method was sliced with a plane parallel with a (100) plane to obtain a GaAs crystal substrate of diameter 50 mm×thickness 0.5 mm. A (100) plane of this GaAs crystal substrate was lapped as follows: a lapping pad was disposed on a platen of a diameter of 300 mm arranged on a lapping apparatus, and a platen and a GaAs crystal substrate were rotated to each other with rotation axes shifted while a lapping slurry with $Al_2O_3$ abrasive grains dispersed therein was supplied to a lapping pad, and a (100) plane of a GaAs crystal substrate fixed to a crystal holder was pressed against a platen. Herein, as a lapping pad, a non-woven pad (Suba800 manufactured by Nitta Haas Incorporated) was used and, as a platen, a stainless platen was used. As an $Al_2O_3$ abrasive grain, three kinds having an abrasive grain diameter of 10 μm, 5 μm and 2 μm were prepared and, as lapping progresses, an abrasive grain diameter was lowered stepwisely. An abrading pressure was 4.9 kPa (50 gf/cm$^2$) to 98 kPa (1000 gf/cm$^2$), and rotation numbers of a GaAs crystal substrate and a platen were 10/min to 200/min. By such the lapping, a surface of a GaAs crystal substrate became specular. In a GaAs crystal substrate after this lapping, a surface roughness Ry was 8.4 nm, and a surface roughness Ra was 0.86 nm. An abrading time in this lapping was 20 min. An average lapping rate was 1.6 μm/min.

(A-2) Chemical Mechanical Polishing (CMP) of GaAs Crystal

A (100) plane of a GaAs crystal substrate after the lapping was chemically mechanically polished as follows. Referring to FIG. 1, that is, a back ((−100)plane) of a GaAs crystal substrate ($Ga_xIn_{1-x}As_yP_{1-y}$ crystal 1) after the lapping was adhered to a ceramic crystal holder 11 with a wax. A polishing pad 18 was disposed on a platen 15 of a diameter of 380 mm arranged on a CMP apparatus (not shown), and a surface ((100) plane) of a GaAs crystal was chemically mechanically polished by rotating a GaAs crystal substrate ($Ga_xIn_{1-x}As_yP_{1-y}$ crystal 1) around a rotation axis 11*c* of crystal holder 11 while a polishing slurry 17 with abrasive grains 16 dispersed therein was supplied to polishing pad 18 from a polishing slurry supply port 19, and polishing pad 18 was rotated around a rotation axis 15*c*, and a GaAs crystal substrate ($Ga_xIn_{1-x}As_yP_{1-y}$ crystal 1) was pressed against polishing pad 18 by placing a weight 14 on crystal holder 11.

Herein, polishing slurry 17 was prepared by dispersing and diluting colloidal silica ($SiO_2$) (Quotron PL-10H manufactured by Fuso Chemical Co., Ltd.) ($SiO_2$ solid matter 24 mass %) having an average particle diameter of a primary particle of 90 nm and an average particle diameter of a secondary particle of 220 nm as abrasive grain 16 in water to a $SiO_2$ solid matter of 15 mass %, and sodium carbonate ($Na_2CO_3$), sodium sulfate ($Na_2SO_4$), sodium tripolyphosphate (Na-TPP), and sodium dichloroisocyanurate (Na-DCIA) as an oxidizing agent were appropriately added to adjust a pH to 9.0, and ORP to 1050 mV. In addition, as polishing pad 18, a suede pad of polyurethane (Supreme RN-R manufactured by Nitta Haas Incorporated) was used and, as platen 15, a stainless platen was used. A polishing pressure was. 19.6 kPa (200 gf/cm$^2$), and both of rotation numbers of a GaAs crystal substrate ($Ga_xIn_{1-x}As_yP_{1-y}$ crystal 1) and polishing pad 18 were 40/min.

A polishing rate in this CMP was 1.5 μm/min. In addition, when surface roughnesses Ry and Ra of a GaAs crystal substrate after CMP were measured using AFM, they were 2.4 nm and 0.25 nm, respectively. The results are summarized in Table 1.

EXAMPLES 2 TO 4, COMPARATIVE EXAMPLES 1 TO 3

According to the same manner as that of Example 1 except that a polishing slurry containing colloidal silica abrasive grains having an average particle diameter $d_1$ of a primary particle, an average particle diameter $d_2$ of a secondary particle, and a $d_2/d_1$ ratio shown in Table 1 as the abrasive grains were used in the. (A-2), lapping and CMP of a GaAs crystal substrate were performed. Surface roughnesses Ry and Ra of the resulting GaAs crystal substrate were measured. The results are summarized in Table 1.

In a polishing slurry of each Example, as an abrasive grain material, Quotron PL-3H ($SiO_2$ solid matter 20 mass %) manufactured by Fuso Chemical Co., Ltd. having $d_1$ of 30 nm, $d_2$ of 80 nm and a $d_2/d_1$ ratio of 2.7 was used in Example 2, Quotron PL-7 ($SiO_2$ solid matter 20 mass %) manufactured by Fuso Chemical Co., Ltd. having $d_1$ of 70 nm, $d_2$ of 130 nm and a $d_2/d_1$ ratio of 1.9 was used in Example 3, Snowtex PS-MO ($SiO_2$ solid matter 18 to 19 mass %) manufactured by Nissan Chemical Industries, Ltd. having $d_1$ of 20 nm, $d_2$ of 150 nm and a $d_2/d_1$ ratio of 7.5 was used in Example 4, and unassociated colloidal silica ($SiO_2$) was used in Comparative Examples 1 to 3, and abrasive grains material were diluted in water to a $SiO_2$ solid matter of 15 mass % in all cases. A pH and ORP of polishing slurries of each Example and each Comparative Example were adjusted as in Example 1. In addition, in a polishing slurry of each Comparative Example, as an abrasive grain material, unassociated colloidal silica having $d_1$ of 40 nm was used in Comparative Example 1, unassociated colloidal silica having $d_1$ of 100 nm was used in Comparative Example 2, and unassociated colloidal silica ($SiO_2$) having $d_1$ of 200 nm was used in Comparative Example 3, and any silica was diluted in water to a $SiO_2$ solid matter of 15 mass %. A pH and ORP of polishing slurries of each Example and each Comparative Example were adjusted as in Example 1.

TABLE 1

| | | | Example 1 | Example 2 | Example 3 | Example 4 | Comparative Example 1 | Comparative Example 2 | Comparative Example 3 |
|---|---|---|---|---|---|---|---|---|---|
| Crystal composition | | | GaAs | GaAs | GaAs | GaAs | GaAs | GaAs | GaAs |
| CMP | Abrasive grain | Average secondary particle diameter $d_2$ (nm) | 220 | 80 | 130 | 150 | — | — | — |
| | | Average primary particle diameter $d_1$ (nm) | 90 | 30 | 70 | 20 | 40 | 100 | 200 |
| | | $d_2/d_1$ ratio | 2.4 | 2.7 | 1.9 | 7.5 | — | — | — |
| | Content of abrasive grain (mass %) | | 15 | 15 | 15 | 15 | 15 | 15 | 15 |
| | Oxidizing agent | | Na-DCIA | Na-DCIA | Na-DCIA | Na-DCIA | Na-DCIA | Na-DCIA | Na-DCIA |
| | Acid, base, salt (pH adjusting agent) | | $Na_2CO_3$, $Na_2SO_4$, Na-TPP | $Na_2CO_3$, $Na_2SO_4$, Na-TPP | $Na_2CO_3$, $Na_2SO_4$, Na-TPP | $Na_2CO_3$, $Na_2SO_4$, Na-TPP | $Na_2CO_3$, $Na_2SO_4$, Na-TPP | $Na_2CO_3$, $Na_2SO_4$, Na-TPP | $Na_2CO_3$, $Na_2SO_4$, Na-TPP |
| | pH of polishing slurry | | 9 | 9 | 9 | 9 | 9 | 9 | 9 |
| | ORP of polishing slurry (mV) | | 1050 | 1050 | 1050 | 1050 | 1050 | 1050 | 1050 |
| | Polishing pressure (kPa) | | 19.6 | 19.6 | 19.6 | 19.6 | 19.6 | 19.6 | 19.6 |
| | Polishing pad rotation number (/min) | | 40 | 40 | 40 | 40 | 40 | 40 | 40 |
| | Crystal rotation number (/min) | | 40 | 40 | 40 | 40 | 40 | 40 | 40 |
| | Polishing rate (μm/min) | | 1.5 | 0.81 | 1.0 | 1.1 | 0.32 | 0.52 | 1.0 |
| Surface assessment after CMP | | Surface roughness Ry (nm) | 2.4 | 1.3 | 2.3 | 1.9 | 2.3 | 3.5 | 6.0 |
| | | Surface roughness Ra (nm) | 0.25 | 0.12 | 0.22 | 0.18 | 0.21 | 0.32 | 0.51 |

Note)
Na-DCIA: sodium dichloroisocyanurate,
$Na_2CO_3$: sodium carbonate,
$Na_2SO_4$: sodium sulfate
Na-TPP: sodium tripolyphosphate As shown in Comparative Examples 1 to 3, when polishing is performed using a polishing slurry containing unassociated spherical colloidal silica abrasive grains, as a particle diameter of an abrasive grain grows larger, a polishing rate is enhanced, but both of surface roughnesses Ry and Ra are increased, and surface quality is deteriorated.

To the contrary, as shown in Examples 1 to 4, by performing CMP using a polishing slurry containing colloidal silica abrasive grains in which the grains are a secondary particle (average particle diameter $d_2$) obtained by association of primary particles (average particle diameter $d_1$), a $d_2/d_1$ ratio is not less than 1.6 and not more than 10, and $d_2$ is not less than 30 nm and not more than 300 nm, and in which a value X of a pH and a value Y (mV) of ORP satisfy a relationship of $-50X+1000 \leqq Y \leqq -50X+1900$, and a pH is 8 or more, under the condition of a polishing pressure of 19.6Pa (200 gf/cm$^2$), and a rotation number of a polishing pad and a GaAs crystal of 40/min, a GaAs crystal substrate having a surface having small surface roughnesses Ry and Ra was obtained at a high polishing rate.

EXAMPLE 5 TO EXAMPLE 7

According to the same manner as that of Example 1 except that a polishing slurry having a pH and ORP shown in Table 2 was used, lapping and CMP of a GaAs crystal substrate were performed. Surface roughnesses Ry and Ra of the resulting GaAs crystal substrate were measured. The results are summarized in Table 2.

In addition, in a polishing slurry of each Example, a pH and ORP were adjusted to each pH and each ORP shown in Table 2 using the same colloidal silica abrasive grain as that of Example 2, using malic acid, sodium malate, and trichloroisocyanuric acid (TCIA) which is an oxidizing agent in Example 5, and using sodium carbonate ($Na_2CO_3$), sodium sulfate ($Na_2SO_4$), sodium tripolyphosphate (Na-TPP), and sodium dichloroisocyanurate (Na-DCIA) which is an oxidizing agent in Example 6. In Example 7, all of an acid, a base, a salt and an oxidizing agent were not added.

TABLE 2

| | | | Example 5 | Example 6 | Example 7 |
|---|---|---|---|---|---|
| Crystal composition | | | GaAs | GaAs | GaAs |
| CMP | Abrasive grain | Average secondary particle diameter $d_2$ (nm) | 80 | 80 | 80 |
| | | Average primary particle diameter $d_1$ (nm) | 30 | 30 | 30 |
| | | $d_2/d_1$ ratio | 2.7 | 2.7 | 2.7 |
| | Content of abrasive grain (mass %) | | 15 | 15 | 15 |
| | Oxidizing agent | | TCIA | Na-DCIA | — |
| | Acid, base, salt (pH adjusting agent) | | Malic acid Na malate | $Na_2CO_3$, $Na_2SO_4$, Na-TPP | — |
| | pH of polishing slurry | | 4 | 9 | 7.5 |
| | ORP of polishing slurry (mV) | | 1200 | 1000 | 600 |
| | Polishing pressure (kPa) | | 19.6 | 19.6 | 19.6 |
| | Polishing pad rotation number (/min) | | 40 | 40 | 40 |

TABLE 2-continued

| | | Example 5 | Example 6 | Example 7 |
|---|---|---|---|---|
| Crystal rotation number (/min) | | 40 | 40 | 40 |
| Polishing rate (μm/min) | | 0.98 | 0.79 | 0.22 |
| Surface assessment after CMP | Surface roughness Ry (nm) | 1.6 | 1.3 | 3.2 |
| | Surface roughness Ra (nm) | 0.15 | 0.12 | 0.28 |

Note)
TCIA: trichloroisocyanuric acid,
Na-DCIA: sodium dichloroisocyanurate
$Na_2CO_3$: sodium carbonate,
$Na_2SO_4$: sodium sulfate,
Na malate: sodium malate
Na-TPP: sodium tripolyphosphate As shown in Examples 5 and 6, by performing CMP using a polishing slurry Containing colloidal silica abrasive grains in which primary particles (average particle diameter $d_1$) are associated to be a secondary particle (average particle diameter $d_2$), a ratio $d_2/d_1$ is not less than 1.6 and not more than 10, and $d_2$ is not less than 30 nm and not more than 300 nm, and in which a value X of a pH and a value Y (mV) of ORP satisfy a relationship of $-50X+1000 \leqq Y \leqq -50x+1900$, and a pH is not higher than 5 or not lower than 8, a GaAs crystal substrate having small surface roughnesses Ry and Ra was obtained at a high polishing rate. In Example 7, a relationship between a value X of a pH and a value Y (mV) of ORP of a polishing slurry is $Y<-50X+1000$, a polishing rate was lowered, and both of surface roughnesses Ry and Ra of a GaAs crystal substrate after CMP were increased.

EXAMPLE 8

(B-1) Lapping of InP Crystal

An InP crystal which had been grown by a LEC (liquid Encapsulated Czochralski) method was sliced with a plane parallel with a (100) plane to obtain an InP crystal substrate of diameter 50 mm×thickness 0.5 mm. A (100) plane of this InP crystal substrate was lapped like (A-1) of Example 1.

(B-2) Chemical Mechanical Polishing (CMP) of InP Crystal

According to the same manner as that of Example 1 except that a polishing slurry obtained by diluting colloidal silica ($SiO_2$) (Quotron PL10H manufactured by Fuso Chemical Co., Ltd.) ($SiO_2$ solid matter 24 mass %) having an average particle diameter $d_1$ of a primary particle of 90 nm, and an average particle diameter $d_2$ of a secondary particle of 220 nm, and a $d_2/d_1$ ratio of 2.4 in water to a $SiO_2$ solid matter of 10 mass %, and adjusting a pH of a polishing slurry to 4, and ORP of a polishing slurry to 1200 mV using citric acid and triochloroisocyanuric acid (TCIA) which is an oxidizing agent was used, a polishing pressure was 29.4 kPa (300 gf/cm$^2$), and a rotation number of a polishing pad and an InP crystal was 50/min, CMP of a (100) plane of InP crystal substrate after lapping was performed. Surface roughnesses Ry and Ra of the resulting InP crystal substrate were measured. The results are summarized in Table 3.

EXAMPLES 9 TO 11, COMPARATIVE EXAMPLES 4 TO 6

According to the same manner as that of Example 8 except that a polishing slurry containing colloidal silica abrasive grains having an average particle diameter $d_1$ of a primary particle, an average particle diameter $d_2$ of a secondary particle and a $d_2/d_1$ ratio shown in Table 2 as the abrasive grains were used in the (B-2), lapping and CMP of an InP crystal substrate were performed. Surface roughnesses Ry and Ra of the resulting InP crystal substrate were measured. The results are summarized in Table 3.

In addition, in a polishing slurry of each Example, as abrasive grain material, Quotron PL-3H ($SiO_2$ solid matter 20 mass %) manufactured by Fuso Chemical Co., Ltd. having $d_1$ of 30 nm, $d_2$ of 80 nm and a $d_2/d$, ratio of 2.7 was used in Example 9, Quotron PL-7 ($SiO_2$ solid matter 20 mass %) manufactured by Fuso Chemical Co., Ltd. having $d_1$ of 70 nm, $d_2$ of 130 nm, and a $d_2/d_1$ ratio of 1.9 was used in Example 10, Snowtex PS-MO ($SiO_2$ solid matter 18 to 19 mass %) manufactured by Nissan Chemical Industries, Ltd. having $d_1$ of 20 nm, $d_2$ of 150 nm, and a $d_2/d_1$ ratio of 7.5 was used in Example 11, and unassociated colloidal silica ($SiO_2$) was used in Comparative Examples 4 to 6, and any of them was diluted in water to a $SiO_2$ solid matter of 10 mass %. In addition, in a polishing slurry of each Comparative Example, as an abrasive grain material, unassociated colloidal silica having $d_1$ of 40 nm was used in Comparative Example 4, unassociated colloidal silica of $d_1$ of 100 nm was used in Comparative Example 5, and unassociated colloidal silica having $d_1$ of 200 nm was used in Comparative Example 6, and any of them was diluted in water to a $SiO_2$ solid matter of 10 mass %. A pH and ORP of polishing slurries of each Example and each Comparative Example were adjusted as in Example 8.

TABLE 3

| | | | Example 8 | Example 9 | Example 10 | Example 11 | Comparative Example 4 | Comparative Example 5 | Comparative Example 6 |
|---|---|---|---|---|---|---|---|---|---|
| Crystal composition | | | InP | InP | InP | InP | InP | InP | InP |
| CMP | Abrasive grain | Average secondary particle diameter $d_2$ (nm) | 220 | 80 | 130 | 150 | — | — | — |
| | | Average primary particle diameter $d_1$ (nm) | 90 | 30 | 70 | 20 | 40 | 100 | 200 |
| | | $d_2/d_1$ ratio | 2.4 | 2.7 | 1.9 | 7.5 | — | — | — |
| | Content of abrasive grain (mass %) | | 10 | 10 | 10 | 10 | 10 | 10 | 10 |

TABLE 3-continued

| | | Example 8 | Example 9 | Example 10 | Example 11 | Comparative Example 4 | Comparative Example 5 | Comparative Example 6 |
|---|---|---|---|---|---|---|---|---|
| | Oxidizing agent | TCIA | TCIA | TCIA | TCIA | TCIA | TCIA | TCIA |
| | Acid, base, salt (pH adjusting agent) | Citric acid | Citric acid | Citric acid | Citric acid | Citric acid | Citric acid | Citric acid |
| | pH of polishing slurry | 4 | 4 | 4 | 4 | 4 | 4 | 4 |
| | ORP of polishing slurry (mV) | 1200 | 1200 | 1200 | 1200 | 1200 | 1200 | 1200 |
| | Polishing pressure (kPa) | 29.4 | 29.4 | 29.4 | 29.4 | 29.4 | 29.4 | 29.4 |
| | Polishing pad rotation number (/min) | 50 | 50 | 50 | 50 | 50 | 50 | 50 |
| | Crystal rotation number (/min) | 50 | 50 | 50 | 50 | 50 | 50 | 50 |
| | Polishing rate (μm/hr) | 20 | 13 | 16 | 18 | 4.2 | 7.0 | 14 |
| Surface assessment after CMP | Surface roughness Ry (nm) | 2.7 | 1.5 | 2.5 | 2.3 | 2.6 | 3.9 | 6.9 |
| | Surface roughness Ra (nm) | 0.28 | 0.14 | 0.25 | 0.21 | 0.24 | 0.37 | 0.62 |

Note)
TCIA: trichloroisocyanuric acid

As shown in Comparative Examples 4 to 6, when polishing is performed using a polishing slurry containing unassociated spherical colloidal silica abrasive grains, as a particle diameter of the abrasive grain grows larger, a polishing rate is enhanced, but both of surface roughnesses Ry and Ra are increased, and surface quality of an InP crystal substrate is deteriorated.

To the contrary, as shown in Examples 8 to 11, by performing CMP using a polishing slurry containing colloidal silica abrasive grains in which primary particles (average particle diameter $d_1$) are associated to be a secondary particle (average particle diameter $d_2$), a $d_2/d_1$ ratio is not less than 1.6 and not more than 10, and $d_2$ is not less than 30 nm and not more than 300 nm, and in which a value X of a pH and a value Y (mV) of ORP satisfy a relationship of $-50X+1000 \leqq Y \leqq -50X+1900$, and a pH is 5 or lower, under the condition of a polishing pressure of 29.4 kPa (300 gf/cm$^2$), and a rotation number of a polishing part and an InP crystal of 50/min, an rip crystal substrate having a surface having small surface roughnesses Ry and Ra was obtained at a high polishing rate.

EXAMPLES 12 TO 15

According to the same manner as that of Example 8 except that a polishing slurry having a pH and ORP shown in Table 4, and the condition of a polishing pressure and a rotation number of a polishing pad and an InP crystal shown in Table 4 were used, lapping and CMP of an InP crystal substrate were performed. Surface roughnesses Ry and Ra of the resulting InP crystal substrate were measured. The results are summarized in Table 4.

In addition, in a polishing slurry of each Example, a pH and ORP were adjusted to each pH and each ORP shown in Table 4 using the same colloidal silica abrasive grain as that of Example 9, using malic acid and-trichloroisocyanuric acid (TCIA) which is an oxidizing agent in Example 12, using sodium malate and trichloroisocyanuric acid (TCIA) which is an oxidizing agent in Example 13, and using nitric acid and trichloroisocyanuric acid (TCIA) which is an oxidizing agent in Example 14. In Example 15, all of an acid, a base, a salt and an oxidizing agent were not added.

TABLE 4

| | | | Example 12 | Example 13 | Example 14 | Example 15 |
|---|---|---|---|---|---|---|
| Crystal composition | | | InP | InP | InP | InP |
| CMP | Abrasive grain | Average secondary particle diameter $d_2$ (nm) | 80 | 80 | 80 | 80 |
| | | Average primary particle diameter $d_1$ (nm) | 30 | 30 | 30 | 30 |
| | | $d_2/d_1$ ratio | 2.7 | 2.7 | 2.7 | 2.7 |
| | Content of abrasive grain (mass %) | | 10 | 10 | 10 | 10 |
| | Oxidizing agent | | TCIA | TCIA | TCIA | — |
| | Acid, base, salt (pH adjusting agent) | | Malic acid | Na malate | $HNO_3$ | — |
| | pH of polishing slurry | | 2.5 | 3.8 | 1.8 | 7.5 |
| | ORP of polishing slurry (mV) | | 1400 | 1250 | 1450 | 600 |
| | Polishing pressure (kPa) | | 29.4 | 29.4 | 29.4 | 29.4 |
| | Polishing pad rotation number (/min) | | 50 | 50 | 50 | 50 |
| | Crystal rotation number (/min) | | 50 | 50 | 50 | 50 |
| | Polishing rate (μm/hr) | | 17 | 12 | 10 | 5 |
| Surface assessment after CMP | Surface roughness Ry (nm) | | 1.8 | 1.7 | 2.0 | 3.9 |
| | Surface roughness Ra (nm) | | 0.15 | 0.14 | 0.17 | 0.32 |

Note)
TCIA: trichloroisocyanuric acid,
Na malate: sodium malate,
$HNO_3$: nitric acid As shown in Examples 12 to 14, by performing CMP using a polishing slurry containing colloidal silica abrasive grains in which primary particles (average particle diameter $d_1$) are associated to be a secondary particle (average particle diameter $d_2$), a ratio $d_2/d_1$ is not less than 1.6 and not more than 10, and $d_2$ is not less than 30 nm and not more than 300 nm, and in which a value X of a pH and a value Y (mV) of ORP satisfy a relationship of $-50X+1000 \leqq Y \leqq -50X+1900$, and a pH is 5 or lower, an InP crystal substrate having small surface roughnesses Ry and Ra was obtained at a high polishing rate. Further, as shown in Examples 12 and 13, by using a polishing slurry containing malic acid or sodium malate which is dicarboxylic acid or a salt thereof as a pH adjusting agent, a rate of polishing an InP crystal substrate was further enhanced.

EXAMPLES 16 TO 18

In Example 1, a step of polishing a GaAs crystal substrate after a CMP step using a KOH aqueous solution having a concentration of 2 normal (referred to as 2N; the same hereinafter) as a basic aqueous solution as shown in Table 5, and/or a step of washing with an ultrasound of 1 MHz ($1\times10^6$ Hz using pure water were performed.

Referring to FIG. 3, in the above polishing step, that is, a back ((−100) plane) of the GaAs crystal substrate ($Ga_xIn_{1-x}As_yP_{1-y}$ crystal 1) after CMP was adhered to a ceramic crystal holder 31 with a wax. A surface ((100) plane) of a GaAs crystal was chemically polished by disposing a polishing pad 38 on a platen 35 of a diameter of 380 mm arranged on a polishing apparatus (not shown), and rotating a GaAs crystal substrate ($Ga_xIn_{1-x}As_yP_{1-y}$ crystal 1) around a rotation axis 31*c* of crystal holder 31 while a polishing solution 37 was supplied to polishing pad 38 from a polishing solution supply port 39, polishing pad 38 was rotated around a rotation axis 35*c*, and a GaAs crystal substrate ($Ga_xIn_{1-x}As_yP_{1-y}$ crystal 1) was pressed against polishing pad 38 by placing a weight 34 on a crystal holder 31. Herein, as polishing pad 38, a suede pad of polyurethane (Supreme RN-R manufactured by Nitta Haas Incorporated) was used and, as platen 35, a stainless platen was used. A polishing pressure was 9.8 Pa (100 gf/cm$^2$), a rotation number of a GaAs crystal substrate ($Ga_xIn_{1-x}As_yP_{1-y}$ crystal 1) and polishing pad 38 was 30/min, and a polishing time was 10 min.

In addition, an ultrasound washing step with pure water was performed by immersing a GaAs crystal substrate after the CMP step or after a chemical polishing step in pure water, and applying an ultrasound of 1 MHz to this pure water. A washing time was 10 min.

Elemental analysis of impurities remaining on a surface of the GaAs crystal substrate after a chemical polishing step or after a pure water washing step was performed using TXRF (total reflection fluorescent X-ray analysis method). The results are summarized in Table 5. As a reference, the results of analysis of impurities remaining on a surface of a GaAs crystal substrate after a CMP step in Example 1 are also described in Table 5.

TABLE 5

| | | | Example 1 | Example 16 | Example 17 | Example 18 |
|---|---|---|---|---|---|---|
| Crystal composition | | | GaAs | GaAs | GaAs | GaAs |
| Surface treating step after CMP | Polishing step using polishing solution | | — | KOH(2N) | — | KOH(2N) |
| | Pure water washing step | | — | — | Ultrasound | Ultrasound |
| Amount of impurities on crystal surface ($\times10^{10}$ atoms/cm$^2$) | | Si | 4100 | 50 | 540 | 40 |
| | | K | 110 | 420 | 40 | 30 |
| | | S | 620 | 420 | 300 | 180 |
| | | Cu | 400 | 110 | 80 | 50 |
| | | Ca | 2800 | 30 | 20 | 10 |

Note)
KOH: potassium hydroxide

As shown in Example 17, by providing a pure water washing step after a CMP step, impurities on a GaAs crystal substrate surface could be reduced. In addition, as shown in Example 16, by providing a chemical polishing step after a CMP step, impurities on a GaAs crystal substrate surface, particularly, a Si atom-containing substance derived from a colloidal silica abrasive grain upon CMP could be remarkably reduced. Further, as shown in Example 18, by providing a pure water washing step after a chemical polishing step, impurities on a GaAs crystal substrate surface, particularly, a K atom-containing substance derived from a polishing solution upon a chemical polishing step could be remarkably reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of treating a surface of a $Ga_xIn_{1-x}As_yP_{1-y}$ crystal ($0\leqq x\leqq1$, $0\leqq y\leqq1$) using a polishing slurry, said surface treating method comprising the steps of:

preparing said polishing slurry containing abrasive grains formed of $SiO_2$, said abrasive grain being a secondary particle in which a primary particle is associated, and a ratio $d_2/d_1$ of an average particle diameter $d_2$ of said secondary particle relative to an average particle diameter $d_1$ of said primary particle being not less than 1.6 and not more than 10; and chemically mechanically polishing the surface of said $Ga_xIn_{1-x}As_yP_{1-y}$ crystal using said polishing slurry, wherein a value X of a pH and a value Y (mV) of an oxidation-reduction potential of said polishing slurry satisfy both relationships of the following equations (1) and (2):

$$Y\geqq-50X+1000 \quad (1)$$

$$Y\leqq-50X+1900 \quad (2).$$

2. The method of treating the surface of the $Ga_xIn_{1-x}As_yP_{1-y}$ crystal according to claim 1, wherein said step of chemically mechanically polishing the surface of said $Ga_xIn_{1-x}As_yP_{1-y}$ crystal using said polishing slurry is performed by rotating a polishing pad and said $Ga_xIn_{1-x}As_yP_{1-y}$ crystal on different rotation axes at a rotation number of not less than 10/min and not more than 200/min and at a polishing pressure of not less than 4.9 kPa and not more than 98 kPa by interposing the polishing slurry between said polishing pad and said $Ga_xIn_{1-x}As_yP_{1-y}$ crystal.

3. The method of treating the surface of the $Ga_xIn_{1-x}As_yP_{1-y}$ crystal according to claim 1, wherein the method comprises a step of washing the surface of said chemical mechanical polished $Ga_xIn_{1-x}As_yP_{1-y}$ crystal with pure water after said step of chemically mechanically polishing.

4. The method of treating the surface of the $Ga_xIn_{1-x}As_yP_{1-y}$ crystal according to claim 1, wherein the method comprises a step of polishing the surface of said chemically mechanically polished $Ga_xIn_{1-x}As_yP_{1-y}$ crystal using a polishing solution formed of an acidic aqueous solution or a basic aqueous solution after said step of chemically mechanically polishing.

5. The method of treating the surface of the $Ga_xIn_{1-x}As_yP_{1-y}$ crystal according to claim 1, wherein the method comprises a step of washing the surface of said $Ga_xIn_{1-x}As_yP_{1-y}$ crystal which has been polished using said polishing solution with pure water after said step of polishing using said polishing solution.

* * * * *